(12) United States Patent
Voronin et al.

(10) Patent No.: US 12,506,112 B2
(45) Date of Patent: Dec. 23, 2025

(54) METHOD FOR ETCHING OF METAL

(71) Applicant: Tokyo Electron Limited, Tokyo (JP)

(72) Inventors: Sergey Voronin, Albany, NY (US); Qi Wang, Albany, NY (US); Christopher Netzband, Albany, NY (US); Gabriel Gibney, Albany, NY (US); Sang Cheol Han, Albany, NY (US); Peter Biolsi, Albany, NY (US); Arkalgud Sitaram, Albany, NY (US); Christophe Vallee, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 512 days.

(21) Appl. No.: 17/937,922

(22) Filed: Oct. 4, 2022

(65) Prior Publication Data
US 2023/0108117 A1  Apr. 6, 2023

Related U.S. Application Data

(60) Provisional application No. 63/252,738, filed on Oct. 6, 2021.

(51) Int. Cl.
*H01L 23/00*  (2006.01)
*C23F 4/00*  (2006.01)
(Continued)

(52) U.S. Cl.
CPC ............... *H01L 24/80* (2013.01); *C23F 4/00* (2013.01); *C23F 4/04* (2013.01); *H01J 37/3266* (2013.01); *H01L 21/3213* (2013.01); *H01L 21/32139* (2013.01); *H01J 37/321* (2013.01); *H01J 37/32449* (2013.01); *H01J 37/32568* (2013.01);
(Continued)

(58) Field of Classification Search
CPC ............... H01L 24/80; H01L 21/3213; H01L 21/32139; H01L 2224/80013; H01L 2224/80031; H01L 2224/80895; H01L 2224/80896; C23F 4/00; C23F 4/04; H01J 37/321; H01J 37/32449; H01J 37/32568; H01J 37/3266; H01J 37/32816;
(Continued)

(56) References Cited

U.S. PATENT DOCUMENTS 8,409,966 B2   4/2013   Ohnuma et al.
11,424,142 B2  8/2022   Mimura et al.
(Continued)

FOREIGN PATENT DOCUMENTS

WO   2020223011 A1   11/2020

OTHER PUBLICATIONS

International Search Report and Written Opinion, Application No. PCT/US2022/045612, mailed Feb. 1, 2023, 11 pages.
(Continued)

*Primary Examiner* — Anita K Alanko
(74) *Attorney, Agent, or Firm* — Slater Matsil, LLP

(57) ABSTRACT

A method of etching a metal includes performing at least two cycles of an etch process. A cycle of the etch process includes: performing a surface modification on an exposed surface of a metal layer over a substrate, performing a hydrogen treatment on the metal layer, and performing a cleaning treatment on the metal layer. The hydrogen treatment forms a layer of reaction products on the metal layer. The cleaning treatment removes the layer of reaction products.

20 Claims, 19 Drawing Sheets

(51) Int. Cl.
*C23F 4/04* (2006.01)
*H01J 37/32* (2006.01)
*H01L 21/3213* (2006.01)
*H01J 37/34* (2006.01)

(52) U.S. Cl.
CPC ......... *H01J 37/32816* (2013.01); *H01J 37/34* (2013.01); *H01J 2237/334* (2013.01); *H01J 2237/335* (2013.01); *H01J 2237/336* (2013.01); *H01L 2224/80013* (2013.01); *H01L 2224/80031* (2013.01); *H01L 2224/80895* (2013.01); *H01L 2224/80896* (2013.01)

(58) Field of Classification Search
CPC ................ H01J 37/34; H01J 2237/334; H01J 2237/335; H01J 2237/336; C23G 5/00
See application file for complete search history.

(56) References Cited

U.S. PATENT DOCUMENTS

| | | | |
|---|---|---|---|
| 11,557,487 B2* | 1/2023 | Longo Pazos | .... H01L 21/32139 |
| 2011/0263096 A1 | 10/2011 | Ohnuma et al. | |
| 2015/0132971 A1 | 5/2015 | Lin et al. | |
| 2016/0042922 A1* | 2/2016 | Omstead | .......... H01L 21/76892 438/712 |
| 2016/0211147 A1* | 7/2016 | Fukazawa | ......... H01L 21/67069 |
| 2017/0229311 A1* | 8/2017 | Tan | ..................... H01L 21/3085 |
| 2018/0223437 A1 | 8/2018 | George et al. | |
| 2020/0142327 A1* | 5/2020 | Roozeboom | .......... F28F 9/0265 |
| 2020/0294824 A1 | 9/2020 | Mimura et al. | |
| 2020/0321220 A1* | 10/2020 | Papalia | ............. H01L 21/28568 |
| 2022/0216050 A1* | 7/2022 | Yu | ..................... H01L 21/02274 |

OTHER PUBLICATIONS

Wu et al., "Mechanistic considerations of low temperature hydrogen-based plasma etching of Cu," Journal of Vacuum Science & Technology B, vol. 29, Issue 1, Jan. 5, 2011, AVS: Science & Technology of Materials, Interfaces, and Processing, 8 pages.

Kaler, S., et al., "Atomic layer etching of silicon dioxide using alternating $C_4F_8$ and energetic $Ar^{\dagger}$ plasma beams," Journal of Physics D: Applied Physics, vol. 50, No. 23, May 16, 2017, 11 pages.

* cited by examiner

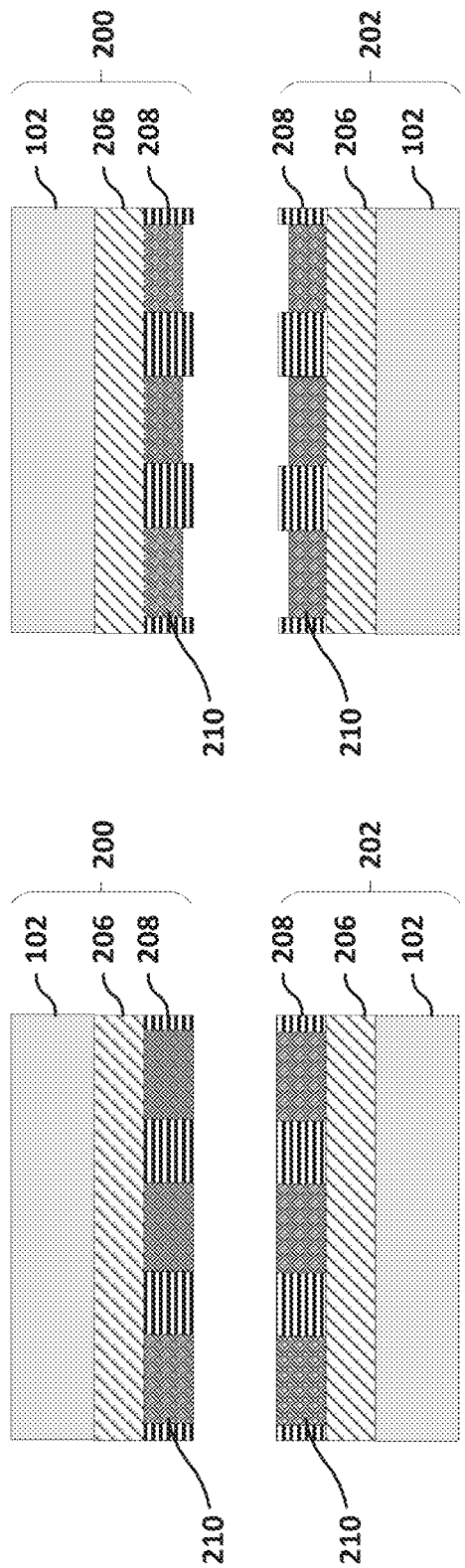

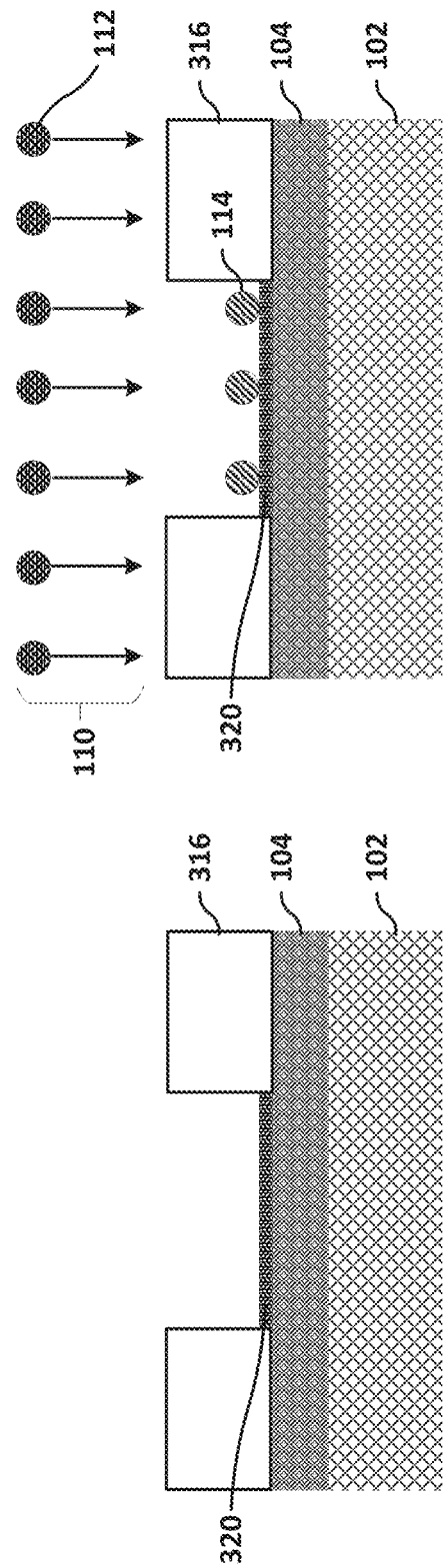

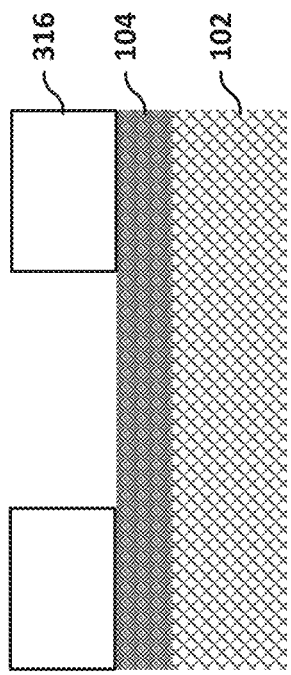
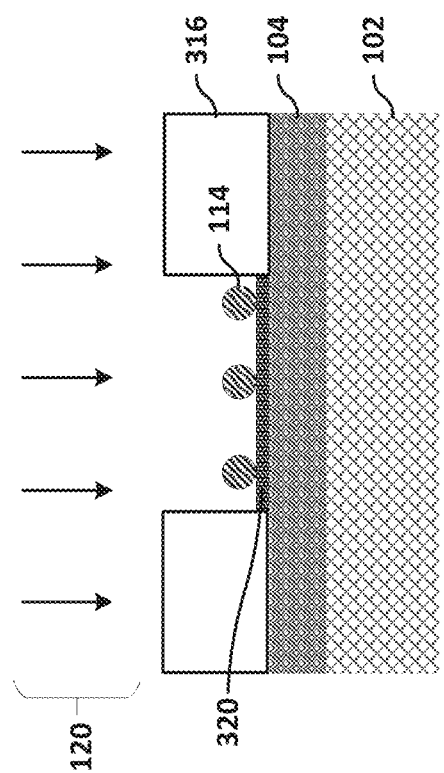

METHOD FOR ETCHING OF METAL

CROSS-REFERENCE TO RELATED APPLICATIONS

This application claims the benefit of U.S. Provisional Application No. 63/252,738, filed on Oct. 6, 2021, and entitled, "Atomic Layer Etching of Copper," which application is hereby incorporated herein by reference.

TECHNICAL FIELD

The present invention relates to the field of semiconductor manufacturing and semiconductor devices, and, in particular embodiments, to a system and method for atomic layer etching of metal.

BACKGROUND

Selective dry etching methods for metals such as copper metal (Cu) at the atomic scale level are useful for a number of different applications in the semiconductor industry. For example, it may be advantageous for 3D integration including hybrid bonding with metal/metal bonding (e.g., Cu/Cu bonding) to have nanometer level control of metal pad recess depth to create proper and reliable electrical contacts. Although recessing the metal pads can be achieved through chemical mechanical planarization (CMP), this may become more difficult as feature sizes decrease and both metal and dielectric surfaces are polished at a same rate.

SUMMARY

In accordance with an embodiment, a method of etching a metal includes: performing at least two cycles of an etch process, where each cycle includes: performing a surface modification on an exposed surface of a metal layer over a substrate; performing a hydrogen treatment on the metal layer, where the hydrogen treatment forms a layer of reaction products on the metal layer; and performing a cleaning treatment on the metal layer, where the cleaning treatment removes the layer of reaction products.

In accordance with another embodiment, a method of smoothing a surface includes: providing a substrate, a metal layer being over the substrate, the metal layer having a rough or oxidized surface; and performing one or more cycles of a smoothing process, where each cycle includes: exposing the rough or oxidized surface to a plasma-excited $H_2$ gas, where the plasma-excited $H_2$ gas chemically reduces the oxidized surface of the metal layer and forms a layer of reaction products on the metal layer; and exposing the rough or oxidized surface to a plasma-excited Ar gas, where the plasma-excited Ar gas removes the layer of reaction products overlying the metal layer, where kinetic energy of the plasma-excited Ar gas is at or below a sputtering threshold for removing metal from the metal layer.

In accordance with yet another embodiment, a plasma processing system includes: a chamber, the chamber including a substrate holder configured to hold a substrate; a gas injection system coupled to the chamber; a vacuum pumping system coupled to the chamber; and a computer coupled to the gas injection system and the vacuum pumping system, where the computer is configured to execute a program, the program including instructions to: expose a metal layer on the substrate to an oxidizing gas; expose the metal layer to a plasma-excited $H_2$ gas; and expose the metal layer to a plasma-excited noble gas.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3D illustrate an application of the method of metal etching to a hybrid bonding process flow, in accordance with some embodiments;

FIGS. 14A-14D illustrate a method of smoothing a surface, in accordance with some embodiments.

Figure 1B:
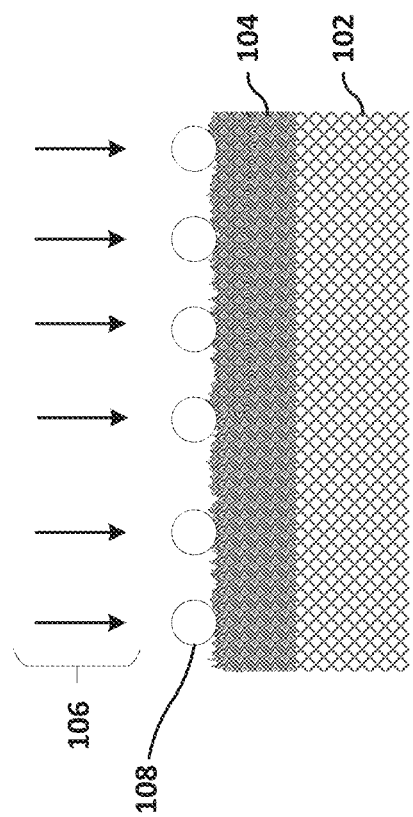
FIGS. 1A-1F illustrates a method of atomic layer etching (ALE) of a metal, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of gas phase atomic layer etching (ALE) of metal (e.g., Cu). The methods provide selective etching of metal relative to other materials found in semiconductor devices such as dielectrics. The disclosed methods may include cycles of a hydrogen treatment step (e.g., with an exposure to $H_2$ plasma) followed by a cleaning treatment step (e.g., a directional removal of the hydrogenated layer by low energetic $Ar^+$ ions). Prior to the hydrogen treatment step, a surface modification step (e.g., an exposure to an oxygen plasma) may be performed to increase surface roughness of the metal. This may be useful for maintaining linearity of the etch process through multiple cycles. In other words, the surface modification step may allow each cycle of the selective etch process to etch a similar amount of metal (e.g., a thickness of 3 Å to 4 Å of metal per cycle). In some embodiments, a substrate is planarized and contains an exposed Cu layer and an exposed dielectric layer in the same horizontal plane. The methods of selective atomic layer etching may be useful for recessing conductive features on top surfaces of wafers with reduced etching or damaging of adjacent dielectric features, which may be advantageous for subsequent bonding of the wafers. Additionally, the methods of selective atomic layer etching may be useful for performing film surface finishing or film surface restoration on top surfaces of metal (e.g., Cu).

Embodiments of the disclosure are described in the context of the accompanying drawings. An embodiment of a method of atomic layer etching (ALE) of a metal will be described using FIGS. 1A-1F. Experimental results for metal etch linearity over one cycle of an embodiment of the method of atomic layer etching (ALE) of a metal will be described using FIG. 2. An application of an embodiment of method of metal etching to a hybrid bonding process flow will be described using FIGS. 3A-3D. Embodiments of methods for bonding wafers will be described using FIGS. 4 and 5. Embodiments of plasma processing systems for selective metal etching will be described using FIGS. 6, 7, 8, and 9. Embodiments of methods for etching a metal will be described using FIGS. 10 and 11. Hydrogen atom interaction with surfaces of different smoothness will be described using FIGS. 12A and 12B. Experimental results of the metal etching amounts per cycle decreasing with additional cycles will be described using FIG. 13. Embodiments of methods for smoothing a surface will be described using FIGS. 14A-14D and FIG. 15.

Figure 1A:
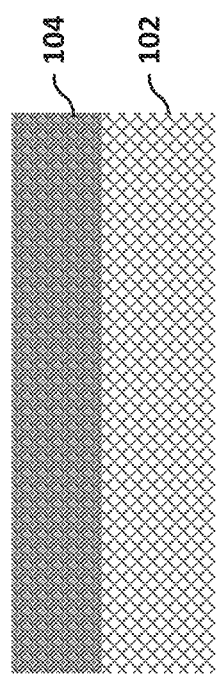

FIGS. 1A-1F illustrate a method of gas phase atomic layer etching (ALE) of a metal (e.g., Cu), in accordance with some embodiments. FIG. 1A shows a cross-sectional view of a substrate 102 and a metal layer 104 over the substrate 102. In various embodiments, the substrate 102 is a silicon wafer having a diameter in a range of 100 mm to 500 mm, such as a diameter of 150 mm, 200 mm, 300 mm, or 450 mm. In various embodiments, the substrate 102 is a part of, or includes, a semiconductor device, and may have undergone a number of steps of processing following a conventional process (e.g., a back end of the line (BEOL) process). The substrate 102 accordingly may comprise layers of semiconductors useful in various microelectronics. For example, the semiconductor structure may comprise the substrate 102 in which various device regions are formed.

In one or more embodiments, the substrate 102 may be a silicon wafer, or a silicon-on-insulator (SOI) wafer. In certain embodiments, the substrate 102 may comprise silicon germanium, silicon carbide, gallium arsenide, gallium nitride, or other compound semiconductors. In other embodiments, the substrate 102 comprises heterogeneous layers such as silicon germanium on silicon, gallium nitride on silicon, silicon carbon on silicon, as well as layers of silicon on a silicon or SOI substrate. In various embodiments, the substrate 102 is patterned or embedded in other components of the semiconductor device. In some embodiments, the substrate 102 comprises conductive features (e.g., metal lines) embedded therein. The conductive features may be electrically coupled to active devices (not illustrated) further embedded in the substrate 102.

The metal layer 104 comprises a metal such as copper (Cu) or the like. The metal layer 104 may be formed with a suitable process such as electroplating, CVD, PVD, ALD, the like, or a combination thereof. In various embodiments, the metal layer 104 is part of a conductive feature such as a metal line or metal pad that is used for a subsequent bonding process with another substrate (see below, FIGS. 3A-3D).

In FIG. 1B, a surface treatment 106 is performed on the metal layer 104. The surface treatment 106 comprises exposing the metal layer 104 to a surface modifying gas 108 that modifies a top surface of the metal layer 104. In some embodiments, the surface modifying gas 108 comprises oxygen and the modification of the top surface of the metal layer 104 is an oxidation process. In one example, the surface modifying gas 108 comprises a plasma-excited $O_2$ gas. In other examples, the surface modifying gas comprises one or more other reactive or oxidizing precursors such as other oxygen-containing gases or non-oxygen-containing gases that are able to chemically oxidize metal (e.g., Cu). In other words, the surface modifying gas increases the oxidation state (e.g., from zero to +1) of metal on the top surface of the metal layer 104, illustrated by particles of the surface modifying gas 108 attaching to the metal layer 104. In various embodiments in which the metal layer 104 is a Cu layer and the surface modifying gas 108 comprises oxygen, the oxidation of the surface of the metal layer 104 forms $CuO_x$ species. A subsequent chemical reduction of the oxidized surface of the metal layer 104 to elemental metal (e.g., Cu) may increase a surface roughness of the metal layer 104 (see below, FIG. 1C). The increase in the surface roughness of the Cu metal layer may increase the amount of metal etching by gas phase atomic layer etching (ALE) as described below with respect to FIG. 1F.

In some embodiments, the surface treatment 106 is omitted and the subsequent hydrogen treatment is performed directly on the exposed metal layer 104. This may be advantageous for increasing the smoothness of the top surface of the metal layer 104.

Figure 1C:
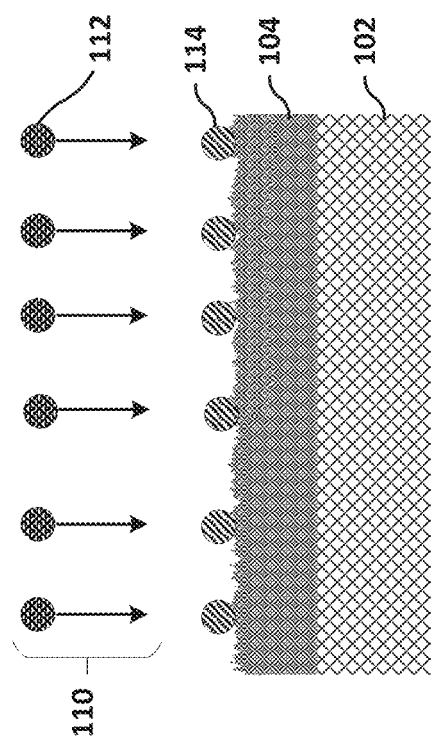
Figure 1D:
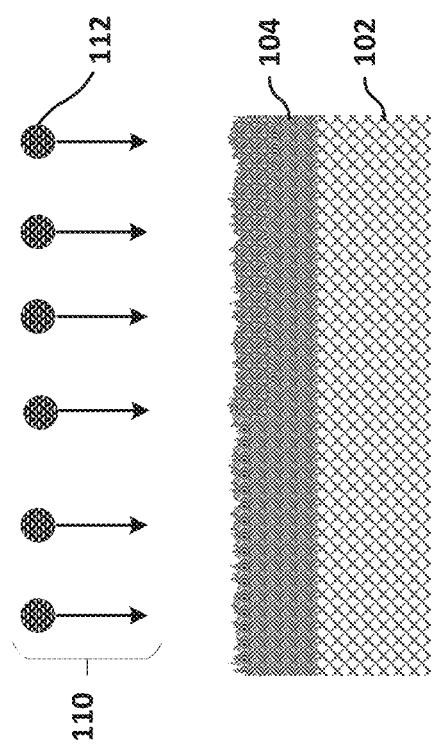

In FIGS. 1C and 1D, a hydrogen treatment 110 (also referred to as a hydrogen treatment step) is performed on the metal layer 104. In some embodiments, the hydrogen treatment 110 comprises exposing the metal layer 104 to a plasma-excited $H_2$ gas. FIG. 1C illustrates the hydrogen treatment 110 chemically reducing the oxidized surface (e.g., by removing oxygen atoms). FIG. 1D illustrates the hydrogen treatment 110 further forming a layer of reaction products 114 on the metal layer 104. In some embodiments in which the metal layer 104 is a Cu layer, the reaction products 114 include $CuH_x$ species, for example $CuH_2$. In one example, in an absence of a biasing accelerating voltage for the majority of high plasma density discharges, the self-bias voltage of the hydrogen treatment 110 will be smaller (e.g., a few volts smaller) than the sputtering threshold (87.3 eV) for Cu metal by $H^+$ ions. In this way, physical sputtering of Cu metal from the metal layer 104 is avoided during the hydrogen treatment 110 (e.g., an exposure to the plasma-excited $H_2$ gas).

Figure 1F:
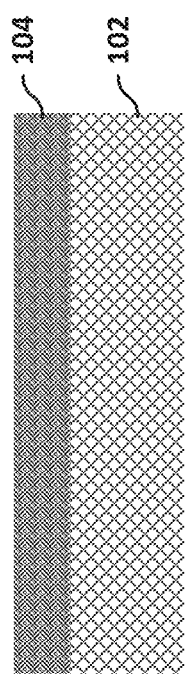
Figure 1E:
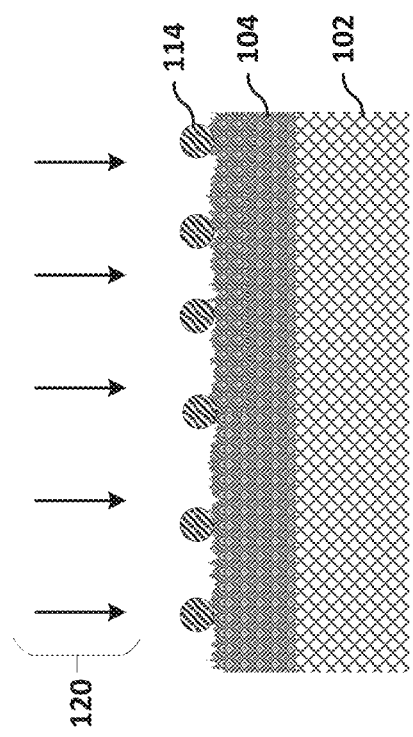

Next, in FIG. 1E, a cleaning treatment 120 is performed to remove the reaction products 114 from the top surface of the metal layer 104. In some embodiments, the cleaning treatment 120 comprises exposing the metal layer 104 to a plasma-excited inert gas that physically dislodges and removes the reaction products 114 (e.g., Cu-containing reaction products such as $CuH_x$) from the metal layer 104. The combination of the formation of the reaction products 114 and the removal of the reaction products 114 thus etches the metal layer 104 as part of one cycle of an atomic layer etching (ALE) process.

As an example of a cleaning treatment 120, the inert gas may comprise argon (Ar), krypton (Kr), neon (Ne), another noble gas, or a combination thereof. In some embodiments, a bias voltage is applied to the substrate 102 during the cleaning treatment 120 (e.g., as exposure to the plasma-excited inert gas). In one example, the bias voltage is selected so that the kinetic energy of the $Ar^+$ ions is below a sputtering threshold (15.8 eV) for removing metal (e.g., Cu) from the metal layer 104. In this way, physical sputtering of metal from the metal layer 104 may be largely avoided during the exposure to the plasma-excited Ar gas. In some examples, the bias voltage can be 30 V or less, 20 V or less, or 15 V or less.

In some embodiments, the hydrogen treatment 110 (e.g., an exposure to a plasma-excited $H_2$ gas) is performed first and, thereafter, the cleaning treatment 120 (e.g., an exposure to a plasma-excited inert gas) is performed. In some embodiments, the hydrogen treatment 110 and the cleaning treatment 120 may at least partially overlap in time.

In one example, respective top surfaces of the exposed metal layer 104 and an exposed dielectric layer (e.g., $SiO_2$) are planarized in the same horizontal plane over the substrate 102. An example of this structure is shown below in FIG. 3A with conductive features 210 of a metal layer and a dielectric layer 208 having a coplanar top surface. Performing the exposure steps described above with respect to FIGS. 1B-1E may provide selective metal (e.g., Cu) etching relative to dielectric (e.g., $SiO_2$) while avoiding sputtering removal of $SiO_2$ since the sputtering threshold for $SiO_2$ removal by $Ar^+$ ions is about 50 eV. Therefore, the atomic layer etching (ALE) process illustrated with respect to FIGS. 1B-1E may be used to selectively etch Cu metal etching relative to $SiO_2$ and many other dielectrics. Other dielectrics include high-k materials, for example $HfO_2$, $ZrO_2$, $Al_2O_3$, $TiO_2$, and the like.

FIG. 1F shows the metal layer 104 after one or more etch cycles have been performed to recess the metal layer 104. An etch cycle of a surface treatment 106 (e.g., exposing the metal layer 104 to a surface modifying gas), a hydrogen treatment 110 (e.g., exposing the metal layer 104 to plasma-excited $H_2$ gas), and a cleaning treatment 120 (e.g., exposing the metal layer 104 to a plasma-excited inert gas such as argon) may be repeated at least once to further etch the metal layer 104. The steps of the etch cycle are self-limiting and therefore the atomic layer etching (ALE) process provides excellent control over the etch rate and etch uniformity. In some embodiments, each etch cycle removes a thickness of 3 Å to 4 Å of metal when the surface treatment 106 is included in the etch cycle. According to some embodiments, the step of exposing the metal layer 104 to a surface modifying gas may be omitted from some of the etch cycles, for example in the final etch cycle and the etch cycles immediately preceding it. This may be advantageous for increasing the smoothness of the top surface of the metal layer 104.

Figure 2:
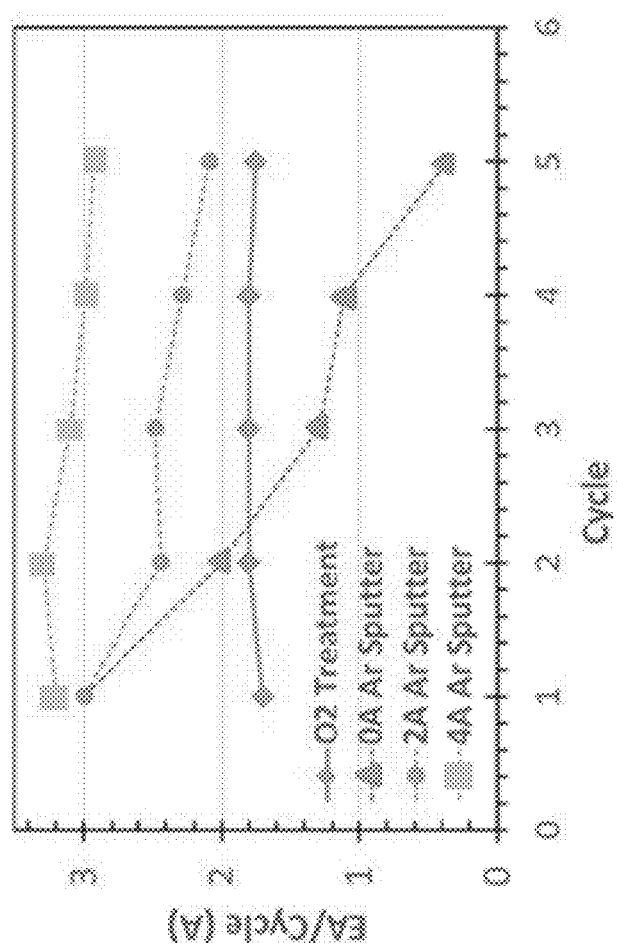
FIG. 2 shows experimental results for metal etch linearity, in accordance with some embodiments.

FIG. 2 shows experimental results for metal etch linearity over one cycle of the atomic layer etching (ALE) process described above with respect to FIGS. 1A-1F for a metal layer 104 (e.g., a Cu metal layer), in accordance with some embodiments. Experimental results have shown that when performing the etch cycle of the ALE process described above with respect to FIGS. 1A-1F a plurality of times and omitting the step of the surface treatment 106 (e.g., exposing the metal layer 104 to a surface modifying gas such as a plasma-excited $O_2$ gas), the amount of Cu metal that is etched in each etch cycle decreases as the number of etch cycles increases. This may be attributed to a smoothing effect that increases the smoothness of the Cu metal layer 104 after each etch cycle. The smoothing of the surface of the Cu metal layer 104 has the effect of reducing the amount of Cu-containing reaction products (e.g., $CuH_x$) that are formed on the Cu metal layer 104 during hydrogen treatment 110 (e.g., exposing the metal layer 104 to plasma-excited $H_2$ gas). This may in turn result in reduced etching of the Cu metal in each etch cycle. The amount of Cu etching per etch cycle may continuously decreases from about 3 Å per etch cycle to about 0.4 Å per etch cycle, as shown in the trace 0 A Ar Sputter in FIG. 2.

In some embodiments, this smoothing effect and resulting reduced Cu etching in each etch cycle may be addressed by including the surface treatment 106 (e.g., exposing the metal layer 104 to a plasma-excited $O_2$ gas) in one or more etch cycles. Oxidation of the surface of the Cu metal layer 104 to form $CuO_x$ species in the surface treatment 106 (also referred to as a surface modifying step) and subsequent chemical reduction of the oxidized surface of the Cu metal layer to elemental Cu during the hydrogen treatment 110 (e.g., exposing the metal layer 104 to the plasma-excited $H_2$ gas) is thought to increase a surface roughness of the Cu metal layer 104. The increase in surface roughness of the Cu metal layer 104 increases the amount of Cu etching in each cycle and restores the linearity of the amount of Cu that is etched in each cycle. The surface modifying step provides an alternative to physical sputtering of the Cu metal layer 104 by energetic $Ar^+$ ions in order to at least partially restore the initial surface roughness of the Cu metal layer. As shown in the trace O2 Treatment in FIG. 2, when a surface modifying step of exposing the substrate to plasma-excited $O_2$ gas was introduced into the beginning of each etch cycle, the etch linearity was restored. However, smaller etch amounts occurred per cycle due to change of process conditions. Additionally, the exposure to the plasma-excited $O_2$ gas was performed using processing conditions that did not result in physical sputtering of Cu metal.

For comparison, FIG. 2 further shows Cu etching using atomic layer etching when Cu sputtering steps were added to the beginning of each etch cycle as an alternative to including the surface modifying step (e.g., exposing the metal layer 104 to a plasma-excited $O_2$ gas). The Cu sputtering steps removed approximately 2 Å (Trace 2A Ar Sputter) and 4 Å (Trace 4A Ar Sputter) of Cu metal. The Cu sputtering steps were performed by exposing the Cu metal layer to plasma-excited Ar gas using a bias voltage applied to the substrate of about 80 eV, which is well above the sputtering threshold of Cu metal by $Ar^+$. The results show that the Cu sputtering steps increased the subsequent amount of Cu metal etched during an exposure to the plasma-excited $H_2$ gas followed by an exposure to the plasma-excited inert gas. This is attributed to increased surface roughness of the Cu metal layer by physical sputtering by energetic $Ar^+$ ions.

The results in FIG. 2 show that the oxidation of the Cu layer by the surface modifying step (e.g., exposing the metal layer 104 to a plasma-excited $O_2$ gas) may result in a similar surface roughness increase as the Cu sputtering steps. Further, the Cu etch amount and etch linearity can be increased by a surface modifying step (e.g., exposing the metal layer 104 to a plasma-excited $O_2$ gas), where the surface modifying step does not result in physical sputtering of Cu metal. Thus, undesirable Cu sputtering and etching of dielectric portions adjacent to the Cu metal layer may be reduced or avoided in the Cu etching process.

In some embodiments, each ALE cycle includes a hydrogen treatment step in an $H_2$ plasma followed by a cleaning treatment step with an $Ar^+$ bombardment (also referred to as an Ar plasma step). No acceleration voltage is applied to the substrate during the $H_2$ plasma exposure. In various embodiments, the ion bombardment energy is 100 eV or less. Precise ion energy control during the following Ar plasma step may be achieved by applying a DC pulse waveform at a given voltage to the substrate (e.g., with 1 µs of on time and 2 µs of off time per period). In some embodiments, the hydrogen treatment step is performed with a gas composition of 40% $H_2$ and 60% Ar by volume, a gas pressure of 100 mTorr, an exposure time of 60 seconds, and an ICP plasma power of 200 W. In some embodiments, the cleaning treatment step (e.g., an exposure to plasma-excited Ar gas) is performed with 50 mTorr of Ar gas, an exposure time of 120 seconds, and a bias voltage of 20 V using DC with a 33% duty cycle (e.g., 1 µs on and 2 µs off per period). In various embodiments, the surface modification step (e.g., exposing the Cu metal layer to a plasma-excited $O_2$ gas) is performed before the hydrogen treatment step and the cleaning treatment step in one or more ALE cycle. In some embodiments, the surface modification step is performed with a gas composition of 50% $O_2$ and 50% Ar by volume, a gas pressure of 50 mTorr, and an exposure time of 30 sec with 0 V of bias voltage. An example of an experimental physical sputtering step for a concept demonstration of surface modification is performed with 100% Ar at 50 mTorr and a pulsed DC voltage of 80 V. By changing the sputtering time from 0 sec to 60 sec, it is possible to physically sputter 0 Å, 2 Å or 4 Å of the surface material as illustrated by the respective traces 0 A Ar Sputter, 2 A Ar Sputter, and 4 A Ar Sputter of FIG. 2.

FIGS. 3A-3D illustrate how the method of metal etching as described above with respect to FIGS. 1A-2 may be applied to an exemplary three dimensional integrated (3DI) hybrid bonding process flow. The wafer bonding process includes bonding a top wafer 200 to a bottom wafer 202. Prior to the wafer bonding process, it is advantageous to perform a precise removal of 2 nm to 5 nm of metal (e.g., Cu) on top surfaces of the top wafer 200 to a bottom wafer 202, where the metal removal process is selective to a dielectric (e.g., $SiO_2$) on the top surfaces of the top wafer 200 and the bottom wafer 202. This may reduce damage to surfaces of the dielectric, reduce an increase in dielectric surface roughness, and provide a reduction in dielectric corner rounding in order to reduce or avoid formation of voids after the wafer bonding process. Additionally, the metal removal process may benefit from non-corrosive chemistry and process chamber contamination by volatile reaction products (e.g., Cu-containing reaction products) may advantageously be reduced or eliminated. The method of metal etching as described above with respect to FIGS. 1A-2 provides the above advantages.

FIG. 3A shows a cross-sectional view of a top wafer 200 and a bottom wafer 202 to be bonded together. In some embodiments, each wafer of the top wafer 200 and the bottom wafer 202 comprises a respective substrate 102 and a CMOS back end of the line (BEOL) layer 206 over the substrate 102. The BEOL layer 206 may comprise active devices (e.g., transistors such as CMOS devices) coupled by conductive features in the BEOL layer 206.

Each wafer of the top wafer 200 and the bottom wafer 202 further comprises conductive features 210 over the BEOL layer 206. In various embodiments, the conductive features are metal lines, metal pads, or the like and comprise copper metal (Cu) or the like. The conductive features 210 are separated by a dielectric layer 208 over the BEOL layer 206. The dielectric layer 208 comprises a suitable dielectric, such as $SiO_2$ or the like. The conductive features 210 may be formed in the dielectric layer 208 by an acceptable process, e.g. a damascene process or the like.

FIG. 3B shows the top wafer 200 and the bottom wafer 202 following a selective etching process that recesses the conductive features 210 below respective top surfaces of the dielectric layers 208. The selective method of metal etching as described above with respect to FIGS. 1A-1F may be used for this step.

Figure 3D:
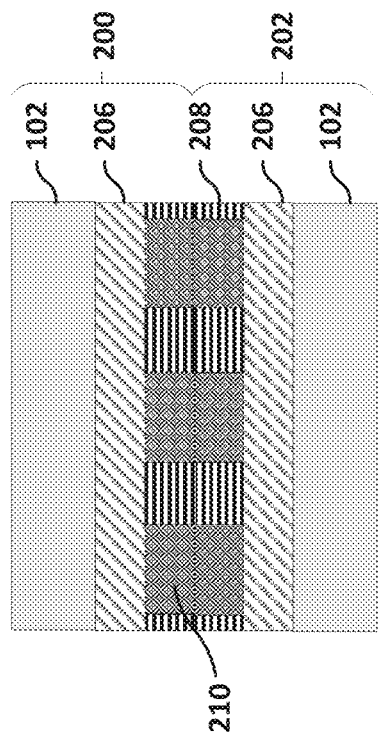
Figure 3C:
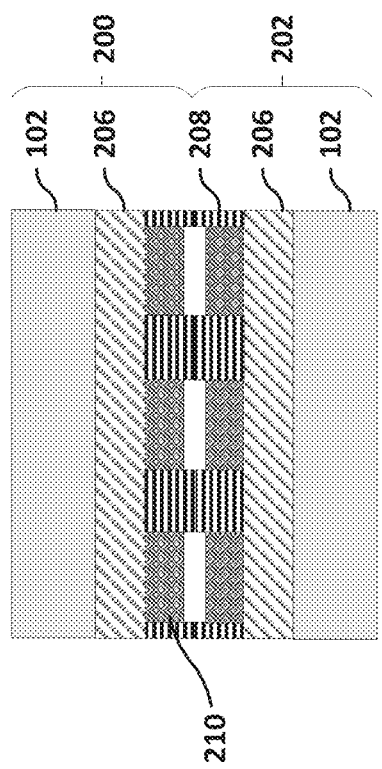

In FIG. 3C, an initial dielectric-dielectric bonding is performed between respective dielectric layers 208 of the top wafer 200 and the bottom wafer 202. In some embodiments, the dielectric-dielectric bonding is a $SiO_2$ to $SiO_2$ bonding.

In FIG. 3D, the respective conductive features 210 of the top wafer 200 and the bottom wafer 202 are bonded to complete the hybrid bonding between the top wafer 200 and the bottom wafer 202. A heat treatment may be performed in order to fill voids between the top wafer 200 and the bottom wafer 202 with a metal reflow. In some embodiments, the metal of the conductive features 210 is copper (Cu) and the heat treatment results in a Cu reflow that produces a Cu to Cu bonding between the top wafer 200 and the bottom wafer 202.

In some embodiments, the selective method of metal etching as described above with respect to FIGS. 1A-1F is performed in a stand-alone etching platform and the top wafer 200 and bottom wafer 202 are subsequently transferred to a separate bonding system for performing the heat treatment and any surface treatment performed before the heat treatment, as described below with respect to FIG. 4. An exemplary bonding system for performing the bonding process of FIGS. 3C-3D is described in U.S. Pat. No. 11,424,142, which is incorporated by reference herein in its entirety. In other embodiments, the etching platform used to perform the selective method of metal etching as described above with respect to FIGS. 1A-1F and the bonding system used to bond the top wafer 200 and bottom wafer 202 are integrated together into a single system, as described below with respect to FIG. 5.

Figure 4:
FIGS. 4 and 5 illustrate process flow chart diagrams of methods for bonding wafers, in accordance with some embodiments.

FIG. 4 illustrates a process flow chart diagram of a method 400 for bonding wafers using an etch platform and a separate bonding apparatus, in accordance with some embodiments. In step 402, an atomic layer etching (ALE) process (e.g., the selective method of metal etching as described above with respect to FIGS. 1A-1F) is performed on respective metal features 210 of a first wafer 200 and a second wafer 202 in an etch platform, as described above with respect to FIGS. 3A-3B. In step 404, the first wafer 200 and the second wafer 202 are moved to a bonding apparatus that is separate from the etching platform. In some embodiments, the first wafer 200 and the second wafer 202 may be transferred from the etching platform to the bonding apparatus after a suitable queueing time.

In step 406, the surfaces of the first wafer 200 and the second wafer 202 are modified in order to prepare the first wafer 200 and the second wafer 202 for a bonding process. The modification of the surfaces of the first wafer 200 and the second wafer 202 and the preparation for the bonding process may include steps of cleaning the first wafer 200 and the second wafer 202, inspecting the first wafer 200 and the second wafer 202 for undesirable deposits, modifying the surfaces of the first wafer 200 and the second wafer 202 (e.g., with an oxygen plasma), hydrophilizing the surfaces of the first wafer 200 and the second wafer 202 (e.g., by flowing pure water over the first wafer 200 and the second wafer 202 while rotating them), and positioning the first wafer 200 over the second wafer 202 in the bonding apparatus. However, any suitable modification and preparation steps may be used.

In step 408, the first wafer 200 and the second wafer 202 are bonded with a suitable bonding process in the bonding apparatus. For example, the first wafer 200 and the second wafer 202 may be positioned together by respective chucks and bonded together by a bonding wave generated by a pressing pin that presses the first wafer 200 and the second wafer 202 together at a central point. However, any suitable bonding process for wafers may be used.

Figure 5:
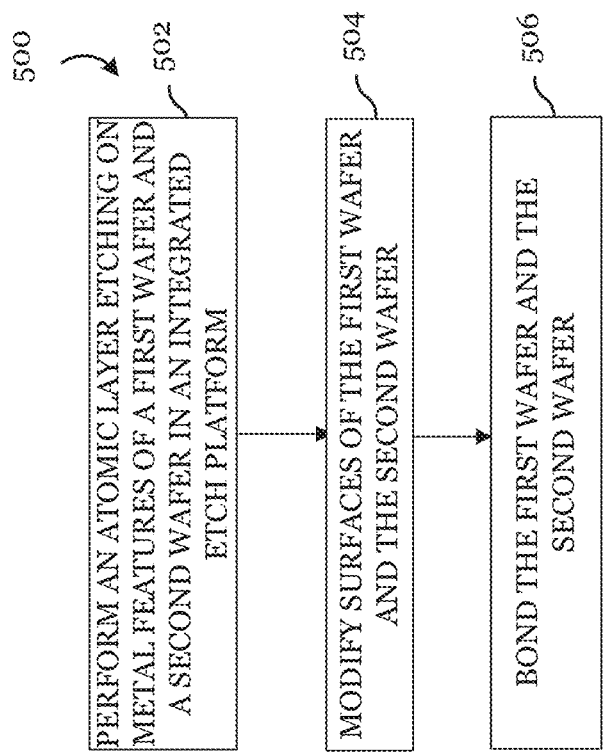

FIG. 5 illustrates a process flow chart diagram of a method 500 for bonding wafers using an integrated etch platform that includes a bonding apparatus, in accordance with some embodiments. In step 502, an atomic layer etching (ALE) process (e.g., the selective method of metal etching as described above with respect to FIGS. 1A-1F) is performed on respective metal features 210 of a first wafer 200 and a second wafer 202, as described above with respect to FIGS. 3A-3B, in an integrated etch platform with a process chamber configured to perform an etch process and a bonding process.

In step 504, the surfaces of the first wafer 200 and the second wafer 202 are modified in order to prepare the first wafer 200 and the second wafer 202 for a bonding process. The surface modification and preparation for bonding performed on the first wafer 200 and the second wafer 202 may be performed using similar methods as described above with respect to step 406 of FIG. 4. In step 506, the first wafer 200 and the second wafer 202 are bonded with a suitable bonding process in the integrated etch platform. The bonding process may be performed with similar methods as described above with respect to step 408 of FIG. 4.

FIGS. 6-9 show cross-sectional views of plasma processing systems for performing the selective method of metal etching as described above with respect to FIGS. 1A-1F, in accordance with various embodiments.

Figure 6:
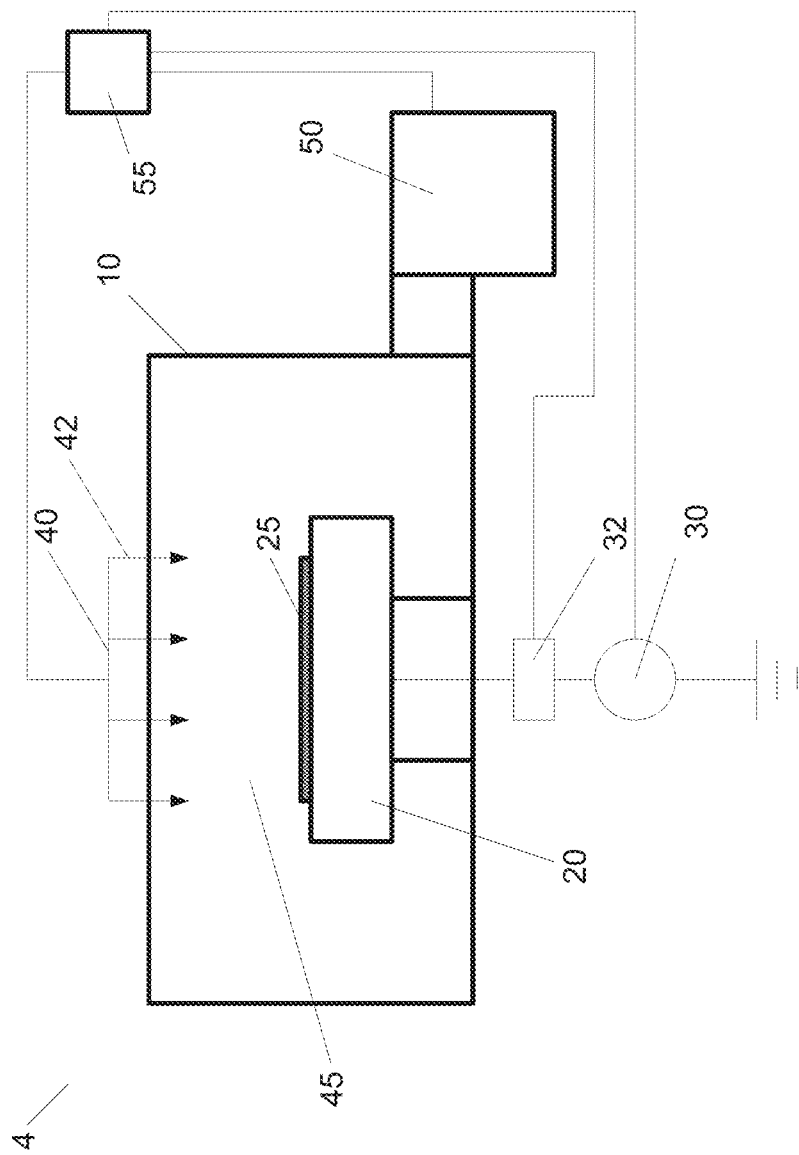
FIGS. 6-9 illustrate plasma processing systems for selective metal etching, in accordance with some embodiments.

FIG. 6 shows a plasma processing system 4, in accordance with some embodiments. The plasma processing system 4 includes a chamber 10, a substrate holder 20 upon which a substrate 25 to be processed is affixed, a gas injection system 40, and a vacuum pumping system 50. The chamber 10 is configured to facilitate the generation of plasma in a processing region 45 adjacent a surface of substrate 25, where plasma is formed via collisions between heated electrons and an ionizable gas. An ionizable gas or mixture of gases is introduced via the gas injection system 40 and the process pressure is adjusted. For example, a gate valve (not shown) is used to throttle the vacuum pumping system 50. The plasma is utilized to create plasma-excited gaseous species for the removal of material from the exposed surfaces of the substrate 25.

The substrate 25 is transferred into and out of chamber 10 through a slot valve (not shown) and chamber feed-through (not shown) via a robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In other embodiments, the substrate 25 is affixed to the substrate holder 20 via an electrostatic clamp (not shown). Furthermore, the substrate holder 20 may further include a cooling system including a re-circulating coolant flow that receives heat from the substrate holder 20 and transfers heat to a heat exchanger system (not shown) when operating in a cooling mode. The cooling system may also transfer heat from the heat exchanger system when operating in a heating mode. Gas may be delivered to the back-side of the substrate 25 to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements such as resistive heating elements or thermo-electric heaters/coolers are included in the substrate holder 20.

Still referring to FIG. 6, the substrate holder 20 further serves as an electrode through which RF power is coupled to a plasma in the processing region 45. For example, the substrate holder 20 may be electrically biased at a RF voltage via the transmission of RF power from an RF generator 30 through an impedance match network 32 to the substrate holder 20. The RF bias serves to form and maintain plasma by energizing electrons. In this configuration, the system operates as a reactive ion etch (RIE) reactor, wherein the chamber and upper gas injection electrode serve as ground surfaces. A typical frequency for the RF bias may be in a range of 1 MHz to 100 MHz, such as 13.56 MHz. In other embodiments, the substrate holder 20 may be electrically biased using a pulsed DC voltage. For example, the pulsed DC voltage may be applied at frequencies in a range of 100 Hz to 10 MHz with a pulse duty cycle in a range of 1% to 99%, which is equivalent to continuous wave (CW) RF power. Additionally, the pulsed DC voltage may be modulated at lower frequencies (e.g., less than 100 Hz) in order to perform a pulse train or pulse wave, if desired.

In one example, RF power is applied to the substrate holder electrode at multiple frequencies. Furthermore, the impedance match network 32 may increase the transfer of RF power to a plasma in processing chamber 10 by reducing the reflected power. The impedance match network 32 may have any suitable match network topology (e.g. L-type, π-type, T-type, etc.) and/or automatic control methods known in the art.

A process gas 42 (also referred to as an etching gas) is introduced to the processing region 45 through the gas injection system 40. In some embodiments, the gas injection system 40 includes a showerhead, wherein the process gas 42 is supplied from a gas delivery system (not shown) to the processing region 45 through a gas injection plenum (not shown), a series of baffle plates (not shown), and a multi-orifice showerhead gas injection plate (not shown).

The vacuum pump system 50 may include a turbo-molecular vacuum pump (TMP) capable of a pumping speed up to 5000 liters per second (and greater) and a gate valve for throttling the chamber pressure. In some plasma processing devices utilized for dry plasma etch processes, a 1000 to 3000 liter per second TMP may be employed. TMPs are useful for low pressure processing, such as for pressures less than 50 mTorr. At higher pressures, the TMP pumping speed may fall off dramatically. For high pressure processing (such as greater than 100 mTorr), a mechanical booster pump and dry roughing pump may be used.

A computer 55 includes a microprocessor, a memory, and a digital I/O port capable of generating control voltages sufficient to communicate and activate inputs to the plasma processing system 4 as well as monitor outputs from the plasma processing system 4. The computer 55 is further coupled to and exchanges information with the RF generator 30, the impedance match network 32, the gas injection system 40, and the vacuum pump system 50. A program stored in the memory of the computer 55 is utilized to activate the inputs to the aforementioned components of a plasma processing system 4 according to a stored process recipe. In various embodiments, the program comprises instructions to expose a metal layer on the substrate held by the substrate holder 25 to an oxidizing gas, expose the metal layer to a plasma-excited $H_2$ gas, and expose the metal layer to a plasma-excited Ar gas, as described above with respect to FIGS. 1A-1F.

Figure 7:
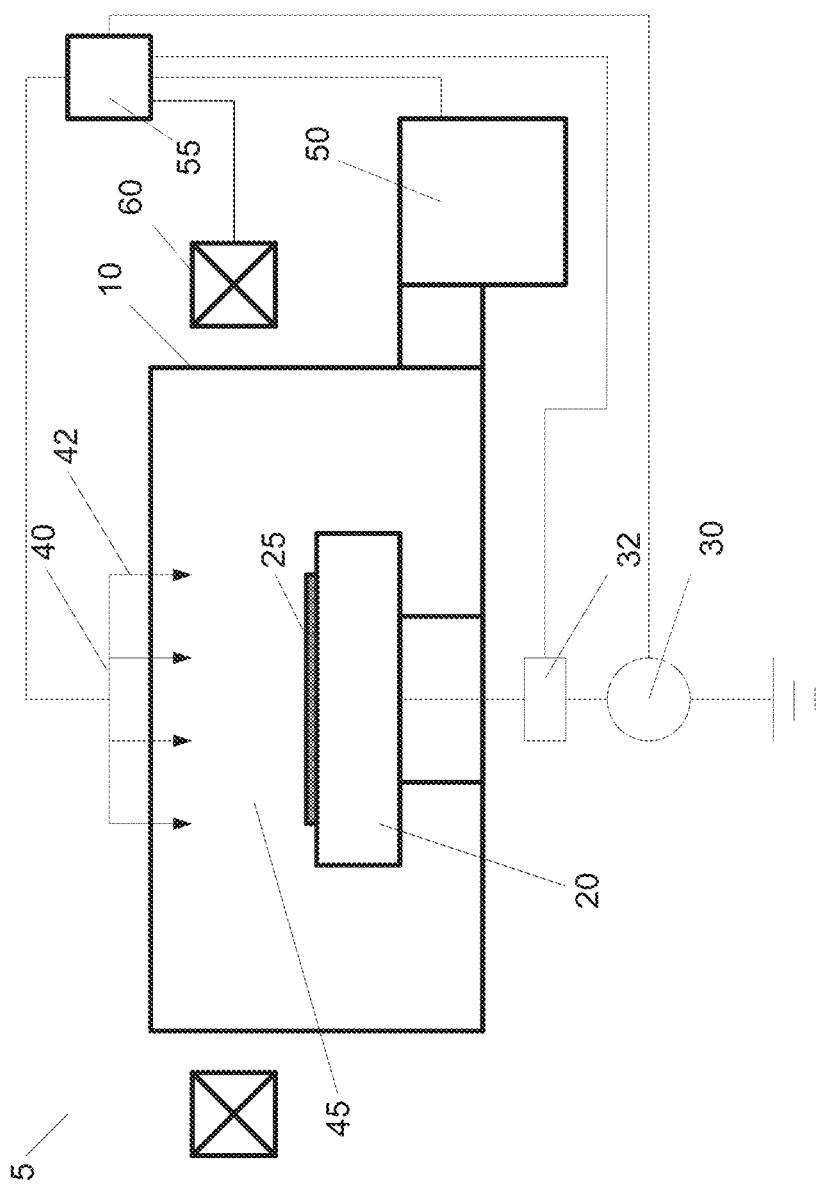

FIG. 7 shows a plasma processing system 5, in accordance with some embodiments. In addition to the various components of the plasma processing system 4 described above with reference to FIG. 6, the plasma processing system 5 further includes either a mechanically or electrically rotating DC magnetic field system 60 in order to potentially increase plasma density and/or improve plasma processing uniformity. Additionally, the computer 55 is coupled to the rotating magnetic field system 60 and is configured to regulate the speed of rotation and field strength.

Figure 8:
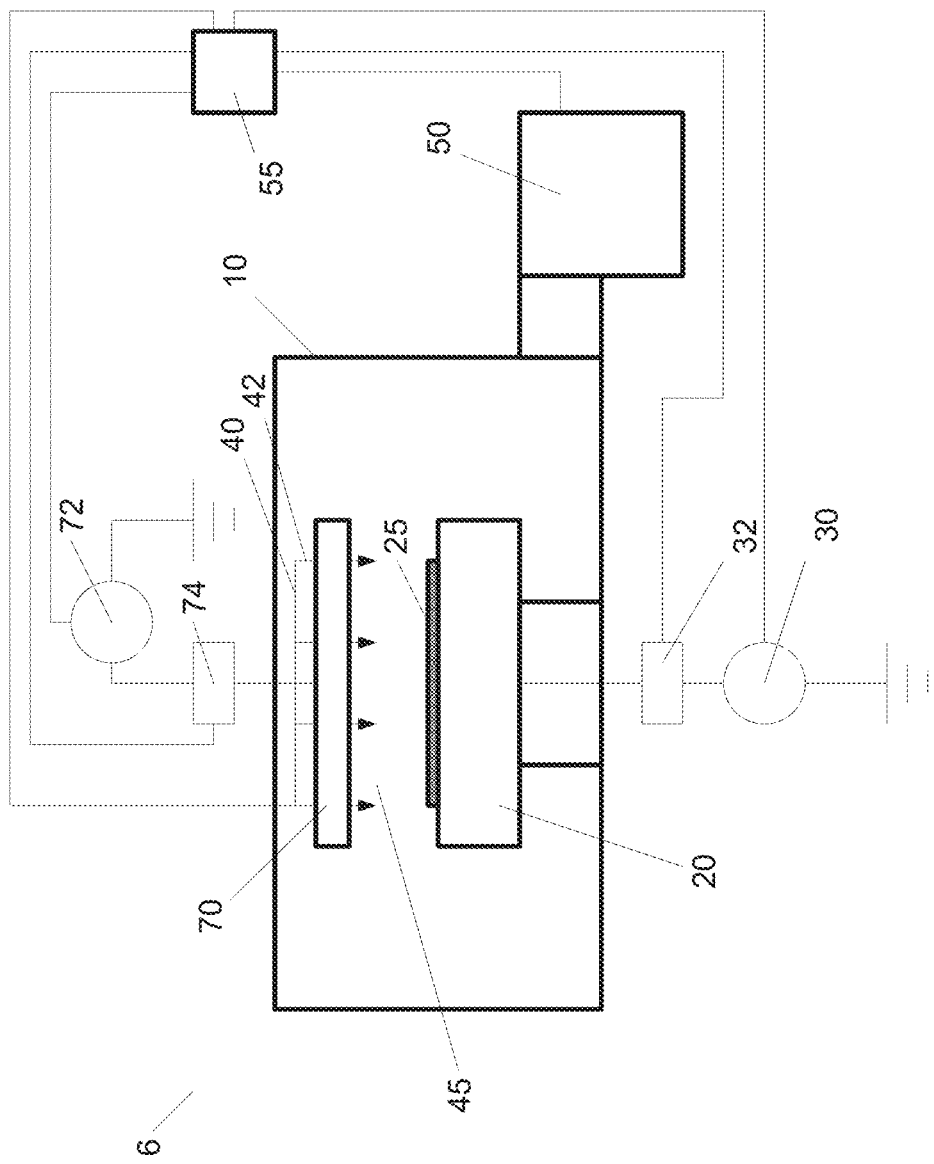

FIG. 8 shows a plasma processing system 6, in accordance with some embodiments. In addition to the various components of the plasma processing system 4 described above with reference to FIG. 6, the plasma processing system 6 further includes an upper plate electrode 70 to which RF power is coupled from an RF generator 72 through an impedance match network 74. Power may be supplied to the upper electrode at a frequency in a range of 10 MHz to 200 MHz, such as 60 MHz. Power may be supplied to the lower electrode at a frequency in a range of 0.1 MHz to 60 MHz, such as 40 MHz. Additionally, the computer 55 is coupled to the RF generator 72 and the impedance match network 74 and is configured to control the application of RF power to the upper electrode 70.

Figure 9:
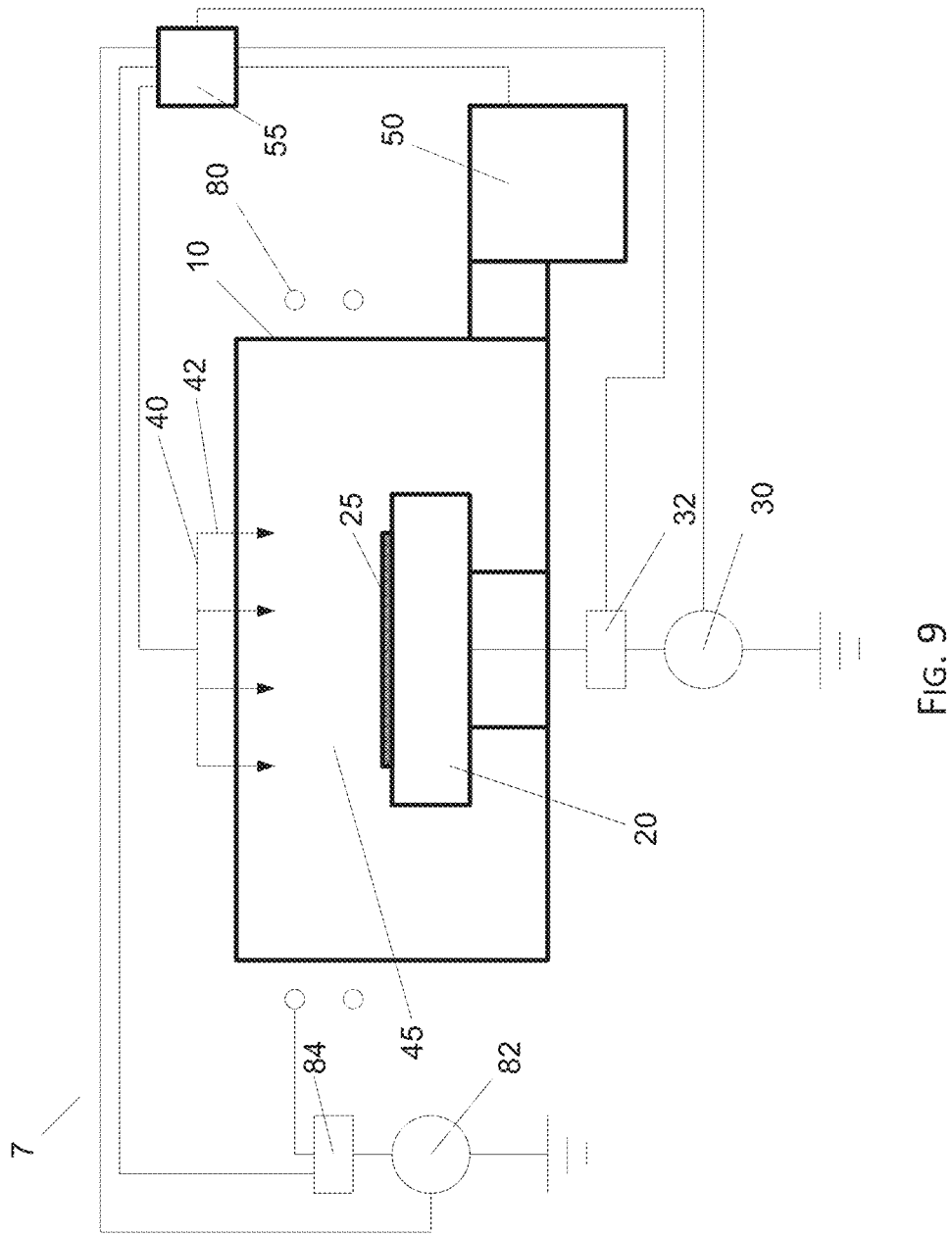

FIG. 9 shows a plasma processing system 7, in accordance with some embodiments. The plasma processing system 7 is an inductively coupled plasma (ICP) system that further includes an inductive coil 80 to which RF power is coupled via an RF generator 82 through an impedance match network 84, in addition to the various components of the plasma processing system 4 described above with reference to FIG. 6. RF power is inductively coupled from the inductive coil 80 through a dielectric window (not shown) to the plasma processing region 45. RF power may be supplied to the inductive coil 80 at a frequency in a range of 400 kHz to 100 MHz, such as 13.56 MHz. Additionally, a slotted Faraday shield (not shown) is employed to reduce capacitive coupling between the inductive coil 80 and plasma in the plasma processing region 45. Furthermore, the computer 55 is coupled to the RF generator 82 and the impedance match network 84 and is configured to control the application of power to the inductive coil 80. RF bias power may be applied to the substrate holder 20 at frequencies in a range of 1 MHz to 100 MHz. In other embodiments, the substrate holder 20 may be electrically biased using a pulsed DC voltage. For example, the pulsed DC voltage may be applied at frequencies in a range of 100 Hz to 10 MHz with a pulse duty cycle in a range of 1% to 99%.

In other embodiments, the plasma is formed using electron cyclotron resonance (ECR) using a frequency in a range of 300 MHz to 9 GHz, such as 2.54 GHz. In still other embodiments, the plasma is formed from the launching of a Helicon wave. In still other embodiments, the plasma is formed from a propagating surface wave.

Figure 10:
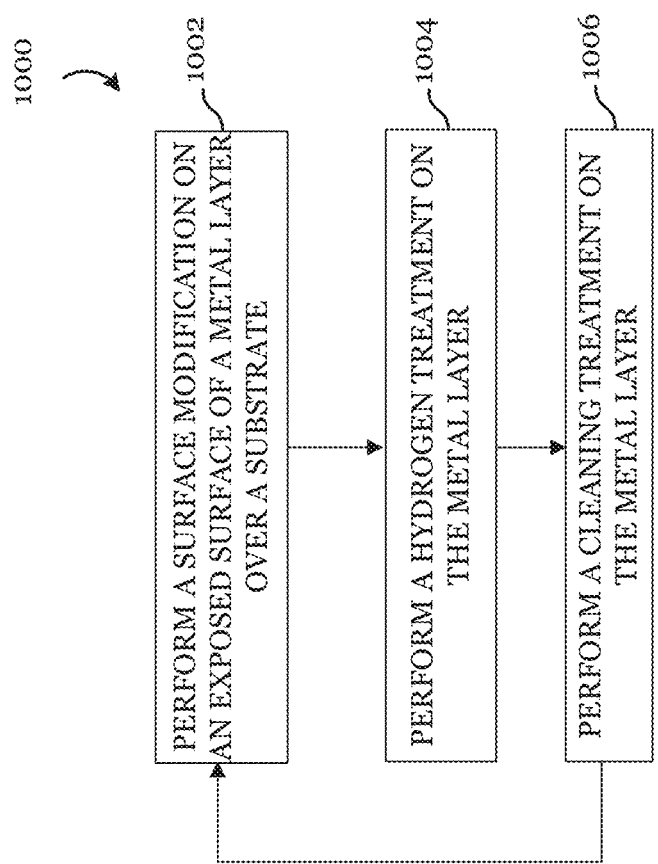
FIGS. 10 and 11 illustrate process flow chart diagrams of methods for etching a metal, in accordance with some embodiments.

FIG. 10 illustrates a process flow chart diagram of a method 1000 for etching a metal, in accordance with some embodiments. In step 1002, a surface modification 106 is performed on an exposed surface of a metal layer 104 over a substrate 102, as described above with respect to FIG. 1B. The surface modification increases a surface roughness of the metal layer 104.

In step 1004, a hydrogen treatment 110 is performed on the metal layer 104, as described above with respect to FIGS. 1C-1D. The hydrogen treatment 110 forms a layer of reaction products 114 on the metal layer 104. In step 1006, a cleaning treatment 120 is performed on the metal layer 104, as described above with respect to FIG. 1E. The cleaning treatment 120 removes the layer of reaction products 114. In various embodiments, one cycle of an etch process comprises steps 1002, 1004, and 1006, and the etch process is performed for at least two cycles. In some embodiments, the step 1002 of the surface modification is omitted in one or more etch cycles, which may be advantageous for increasing smoothness of the top surface of the metal layer 104.

Figure 11:
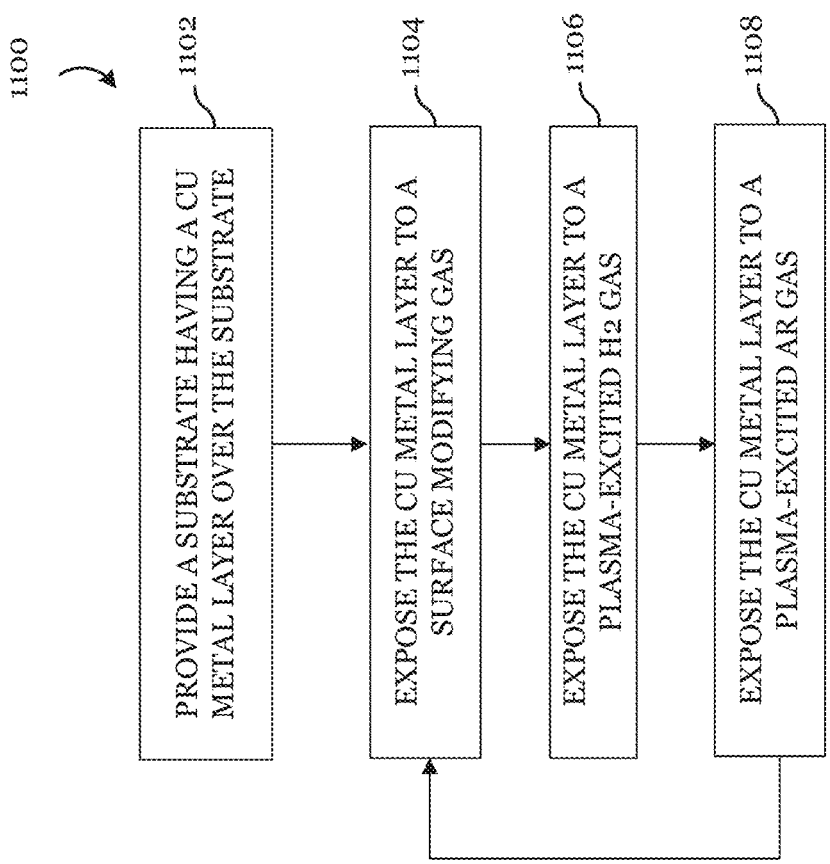

FIG. 11 illustrates a process flow chart diagram of a method 1100 for etching a metal, in accordance with some embodiments. In step 1102, a substrate 102 having a Cu metal layer 104 over the substrate 102 is provided, as described above with respect to FIG. 1A.

Next, an etch process is performed, in which a first cycle of the etch process includes steps 1104 through 1108. In step 1104, the Cu metal layer 104 is exposed to a surface modifying gas (e.g., a plasma-excited $O_2$ plasma) in a surface treatment 106, as described above with respect to FIG. 1B. The surface modifying gas oxidizes a surface of the Cu metal layer 104. In step 1106, the Cu metal layer 104 is exposed to a plasma-excited $H_2$ gas 112, as described above with respect to FIGS. 1C-1D. The plasma-excited $H_2$ gas 112 chemically reduces the oxidized surface of the Cu metal layer 104 and forms a layer of Cu-containing reaction products 114 on the Cu metal layer 104.

In step 1108, the Cu metal layer 104 is exposed to a plasma-excited Ar gas in a cleaning treatment 120, as described above with respect to FIG. 1E. The plasma-excited Ar gas removes the layer of Cu-containing reaction products 114 overlying the Cu metal layer 104. In some embodiments, the kinetic energy of the plasma-excited Ar gas is at or below a sputtering threshold for removing Cu metal from the Cu metal layer 104. Subsequently, additional cycles of the etch process may be performed, wherein each additional cycle includes steps 1104 through 1108. In some embodiments, step 1104 including exposing the Cu metal layer 104 to a surface modifying gas is omitted in one or more cycles of the etch process, which may be advantageous for increasing smoothness of the top surface of the Cu metal layer 104.

Methods of selective atomic layer etching may be useful for performing film surface finishing or film surface restoration on top surfaces of metal (e.g., Cu). Metal films such as Cu films may have native oxide on exposed surfaces or have otherwise essentially rough surfaces. Film surface finishing or smoothing may be advantageous for, e.g., improving the bonding of Cu metal pads during hybrid bonding of wafers. Methods of the disclosure allow for increased metal surface smoothness by selective removal of a few atomic layers in a cyclic manner, e.g. after a few atomic layer etching (ALE) cycles. In some embodiments, a highly selective, self-limited, cyclic two-step treatment of a metal surface (e.g., a Cu surface) is used for native oxide removal and surface restoration. This surface treatment allows for selective restoration of small metal (e.g., Cu) pads and areas at nanometer scale on patterned structures.

Figure 12B:
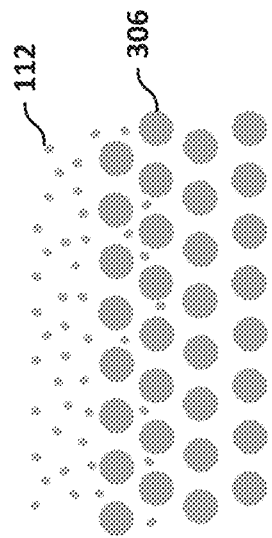
FIGS. 12A and 12B illustrate hydrogen atom interaction with surfaces of different smoothness, in accordance with some embodiments.
Figure 12A:
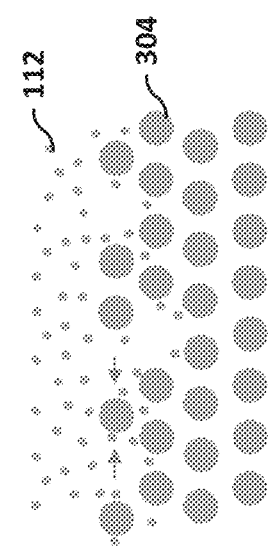

FIGS. 12A and 12B illustrate hydrogen atom interaction with surfaces of different smoothness, in accordance with some embodiments. FIG. 12A shows a cross-sectional view of a rough metal surface 304, such as a close-up view of a top surface of a metal layer 104 (see above, FIGS. 1A-1B). The metal surface 304 is rough with spaces between top atoms of its metal lattice. In various examples, the roughness of the metal surface 304 is a result of a surface modification 106 (see above, FIG. 1B) or an Ar$^+$ sputtering. Due to the roughness of the metal surface 304, it may be easier for hydrogen atoms (e.g., of a plasma-excited H$_2$ gas 112) to enter into the spaces of the metal surface 304 and reacting and/or chemisorb with atoms of the metal surface 304. This may increase the amount of material removed by a subsequent cycle of an ALE process (see above, FIGS. 1C-1E).

FIG. 12B shows a cross-sectional view of a smooth metal surface 306, such as a close-up view of a top surface of a metal layer 104 before a surface modification 106 or after multiple cycles of an ALE process (see above, FIG. 1F). The metal surface 306 is smooth with a more even distribution of atoms. Due to the smoothness of the metal surface 306, it may be more difficult for hydrogen atoms (e.g., of a plasma-excited H$_2$ gas 112) to react with metal atoms of the metal surface 306. This may decrease the amount of material removed by a subsequent cycle of an ALE process.

Figure 13:
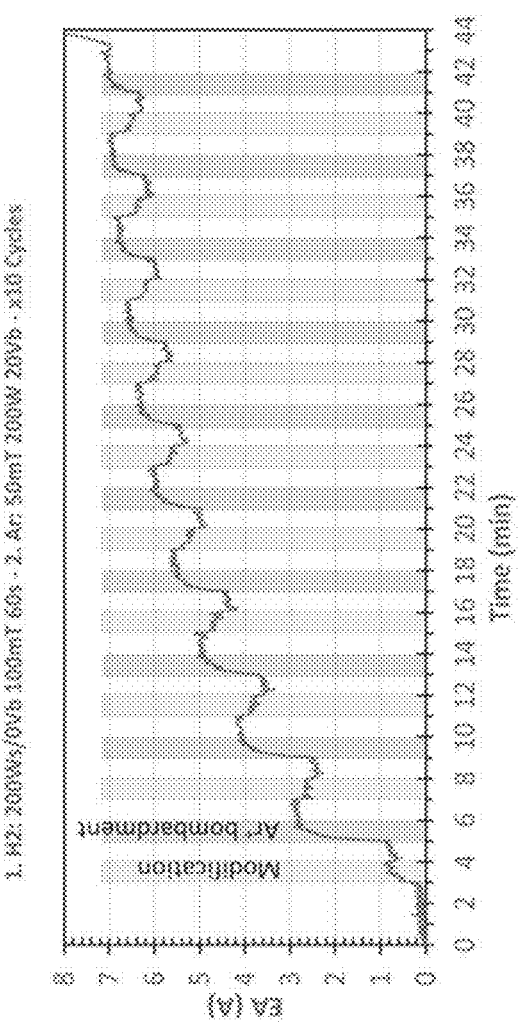
FIG. 13 shows experimental results of metal etching amounts per cycle decreasing with additional cycles, in accordance with some embodiments.

FIG. 13 shows experimental results of the amount of material etched per cycle from a metal surface, also referred to as the etching amount (EA) per cycle, decreasing with additional cycles of an atomic layer etching (ALE) process. The experimental results shown in FIG. 13 are a detailed view of the cumulative etching amount trace 0 A Ar Sputter shown above in FIG. 2. Each cycle of the ALE process included a hydrogen treatment step (also referred to as a modification) and a cleaning treatment step (also referred to as an Ar$^+$ bombardment). In the illustrated experimental results, the hydrogen treatment step was performed at a gas pressure of 100 mTorr, an exposure time of 60 seconds, and a plasma power of 200 W with no bias voltage, and the cleaning treatment step was performed with 50 mTorr of Ar gas, a plasma power of 200 W, and a bias voltage of 20 V, for ten cycles of the ALE process. As shown in FIG. 13, the EA per cycle decreases with additional cycles. This may be due to a decrease in surface roughness after each cycle which may inhibit the reaction and chemisorption of hydrogen atoms on the metal surface, as described above with respect to FIGS. 12A and 12B. As such, repeated cycles of an ALE process including a hydrogen treatment step and a cleaning treatment step may be useful for performing film surface finishing or film surface restoration on top surfaces of metal (e.g., Cu).

FIGS. 14A through 14D illustrate a method of smoothing a metal surface, in accordance with some embodiments. FIG. 14A shows a cross-sectional view of a substrate 102 and a metal layer 104 over the substrate 102. A rough or oxidized surface 320 is present over the metal layer 104. In various embodiments, the rough or oxidized surface 320 includes a native oxide, is an essentially rough surface of a newly formed copper film, or has been oxidized by a surface modification 106 (see above, FIG. 1B). In some embodiments, a mask 316 is formed over the metal layer 104 to expose a portion of the rough or oxidized surface 320. The mask 316 may be, for example, a photoresist patterned by a suitable lithographic process. However, any suitable mask 316 may be used.

In FIG. 14B, a hydrogen treatment 110 is performed on the rough or oxidized surface 320. In some embodiments, the hydrogen treatment 110 comprises exposing the metal layer 104 to a plasma-excited H$_2$ gas. The hydrogen treatment 110 may be performed with similar methods as described above with respect to FIGS. 1B-1C. FIG. 14B illustrates the hydrogen treatment 110 activating the rough or oxidized surface 320 by further forming a layer of reaction products 114 on the rough or oxidized surface 320.

In FIG. 14C, a cleaning treatment 120 is performed to remove the reaction products 114 from the top surface of the rough or oxidized surface 320. In some embodiments, the cleaning treatment 120 comprises exposing the rough or oxidized surface 320 to a plasma-excited inert gas that physically dislodges and removes the reaction products 114 (e.g., Cu-containing reaction products such as CuH$_x$) from the rough or oxidized surface 320. The cleaning treatment 120 may be performed with similar methods as described above with respect to FIG. 1E, such as with low energy Ar$^+$ ion bombardment. The combination of the formation of the reaction products 114 and the removal of the reaction products 114 thus removes an atomic layer from the rough or oxidized surface 320 as part of one cycle of an atomic layer etching (ALE) process.

FIG. 14D illustrates a cross-sectional view of the structure after multiple cycles of the ALE process have removed the rough or oxidized surface 320. After removal of a few atomic layers at angstrom scale of the rough or oxidized surface 320, the remaining top surface of the metal layer 104 has increased smoothness. The multiple cycles of the ALE process allow for selective restoration of small metal (e.g., Cu) pads and areas at nanometer scale on patterned structures. In some embodiments where the mask 316 is present, the mask 316 is removed after the ALE process is completed by a suitable process, e.g. an ashing in an oxygen plasma.

Figure 15:
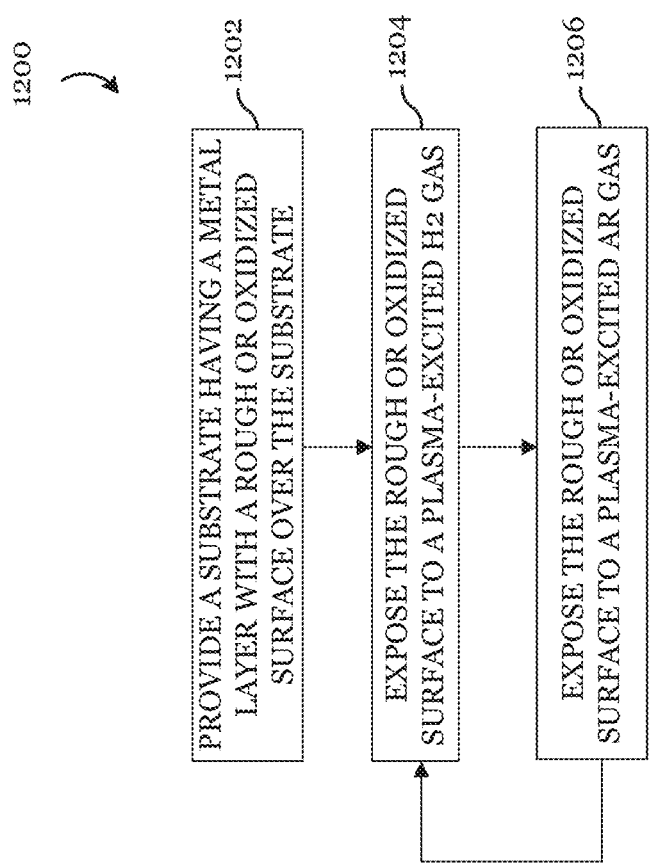
FIG. 15 illustrates a process flow chart diagram of a method for smoothing a surface, in accordance with some embodiments.

FIG. 15 illustrates a process flow chart diagram of a method 1200 for smoothing a surface, in accordance with some embodiments. In step 1202, a substrate 102 having a metal layer 104 over the substrate 102 is provided, where the metal layer 104 has a rough or oxidized surface 320, as described above with respect to FIG. 14A. In some embodiments, the rough or oxidized surface 320 is the product of a surface modification 106 performed as a step of a method 1000 or 1200 for etching a metal, as described above with respect to FIGS. 10 and 11, respectively.

Next, an etch process is performed, in which a first cycle of the etch process includes steps 1204 and 1206. In step 1204, the rough or oxidized surface 320 is exposed to a plasma-excited H$_2$ gas 112, as described above with respect to FIG. 14B. The plasma-excited H$_2$ gas 112 chemically reduces the rough or oxidized surface 320 and forms a layer of reaction products 114 on the rough or oxidized surface 320.

In step 1206, the rough or oxidized surface 320 is exposed to a plasma-excited Ar gas in a cleaning treatment 120, as described above with respect to FIG. 14C. The plasma-excited Ar gas removes the layer of reaction products 114 overlying the rough or oxidized surface 320. In some embodiments, the kinetic energy of the plasma-excited Ar gas is at or below a sputtering threshold for removing metal from the metal layer 104. Subsequently, additional cycles of the etch process may be performed, wherein each additional cycle includes steps 1204 and 1206, until the rough or oxidized surface 320 is removed or the exposed surface of the metal layer 104 reaches a desired smoothness.

Example embodiments of the disclosure are summarized here. Other embodiments can also be understood from the entirety of the specification as well as the claims filed herein.

Example 1. A method of etching a metal, the method including: performing at least two cycles of an etch process, where each cycle includes: performing a surface modification on an exposed surface of a metal layer over a substrate;

performing a hydrogen treatment on the metal layer, where the hydrogen treatment forms a layer of reaction products on the metal layer; and performing a cleaning treatment on the metal layer, where the cleaning treatment removes the layer of reaction products.

Example 2. The method of example 1, where the surface modification includes oxidizing the exposed surface of the metal layer.

Example 3. The method of one of examples 1 or 2, where the hydrogen treatment includes exposing the metal layer to a plasma-excited $H_2$ gas.

Example 4. The method of one of examples 1 to 3, where the cleaning treatment includes exposing the metal layer to a plasma-excited noble gas.

Example 5. The method of one of examples 1 to 4, where a first cycle of the etch process removes a thickness of 3 Å to 4 Å of the metal layer.

Example 6. A method of smoothing a metal surface, the method including: providing a substrate, a metal layer being over the substrate, the metal layer having a rough or oxidized surface; and performing one or more cycles of a smoothing process, where each cycle includes: exposing the rough or oxidized surface to a plasma-excited $H_2$ gas, where the plasma-excited $H_2$ gas chemically reduces the oxidized surface of the metal layer and forms a layer of reaction products on the metal layer; and exposing the rough or oxidized surface to a plasma-excited Ar gas, where the plasma-excited Ar gas removes the layer of reaction products overlying the metal layer, where kinetic energy of the plasma-excited Ar gas is at or below a sputtering threshold for removing metal from the metal layer.

Example 7. The method of example 6, further including: forming a mask over the metal layer, the mask exposing the rough or oxidized surface; and after performing the one or more cycles of the smooth process, removing the mask.

Example 8. The method of one of examples 6 or 7, further including performing an etch process before performing the smoothing process, where a cycle of the etch process includes: exposing the metal layer to an oxidizing gas; exposing the metal layer to the plasma-excited $H_2$ gas; and exposing the metal layer to the plasma-excited Ar gas.

Example 9. The method of one of examples 6 to 8, where the substrate is planarized and contains the metal layer and a dielectric layer in the same horizontal plane.

Example 10. The method of example 9, where the metal layer is selectively etched relative to the dielectric layer.

Example 11. The method of example 10, where the dielectric layer includes $SiO_2$ or a high-k material.

Example 12. The method of one of examples 6 to 11, where the smoothing process utilizes an inductively coupled plasma (ICP) system.

Example 13. The method of one of examples 6 to 11, where the kinetic energy of the plasma-excited Ar gas is controlled by applying a RF or pulsed DC bias voltage to the substrate.

Example 14. The method of one of examples 6 to 13, where the metal layer includes copper.

Example 15. A plasma processing system including: a chamber, the chamber including a substrate holder configured to hold a substrate; a gas injection system coupled to the chamber; a vacuum pumping system coupled to the chamber; and a computer coupled to the gas injection system and the vacuum pumping system, where the computer is configured to execute a program, the program including instructions to: expose a metal layer on the substrate to an oxidizing gas; expose the metal layer to a plasma-excited $H_2$ gas; and expose the metal layer to a plasma-excited noble gas.

Example 16. The plasma processing system of example 15, further including a first RF generator, the first RF generator being coupled to the substrate holder, where the substrate holder serves as an electrode through which RF power is coupled to plasma in the chamber.

Example 17. The plasma processing system of example 16, further including a rotating DC magnetic field system around the chamber.

Example 18. The plasma processing system of example 16, further including: an upper plate electrode above the substrate holder; and a second RF generator coupled to the upper plate electrode.

Example 19. The plasma processing system of example 16, further including: an inductive coil around the chamber; and a second RF generator coupled to the inductive coil.

Example 20. The plasma processing system of example 19, where RF power with a frequency in a range of 400 kHz to 100 MHz is inductively coupled from the inductive coil to a plasma processing region in the chamber.

Example 21. A method of etching a metal, the method including: providing a substrate, where a Cu metal layer is over the substrate; and performing a first cycle of an etch process, the first cycle including: exposing the Cu metal layer to a surface modifying gas, where the surface modifying gas oxidizes a surface of the Cu metal layer; exposing the Cu metal layer to a plasma-excited $H_2$ gas, where the plasma-excited $H_2$ gas chemically reduces the oxidized surface of the Cu metal layer and forms a layer of Cu-containing reaction products on the Cu metal layer; and exposing the Cu metal layer to a plasma-excited Ar gas, where the plasma-excited Ar gas removes the layer of Cu-containing reaction products overlying the Cu metal layer, where kinetic energy of the plasma-excited Ar gas is at or below a sputtering threshold for removing Cu metal from the Cu metal layer.

Example 22. The method of example 21, further including performing a second cycle of the etch process, where the second cycle of the etch process includes the same steps as the first cycle.

Example 23. The method of one of examples 21 or 22, where the surface modifying gas includes a plasma-excited $O_2$ gas.

Example 24. The method of example 23, where the kinetic energy of the plasma-excited $O_2$ gas exposed to the Cu metal layer is at or below a sputtering threshold for removing Cu metal from the Cu metal layer.

Example 25. The method of one of examples 21 to 24, where the substrate is planarized and contains the Cu metal layer and a dielectric layer in the same horizontal plane.

Example 26. The method of example 25, where the Cu metal layer is selectively etched relative to the dielectric layer.

Example 27. The method of one of examples 25 or 26, where the dielectric layer includes $SiO_2$ or a high-k material.

Example 28. The method of one of examples 21 to 27, where the first cycle of the etch process utilizes an inductively coupled plasma (ICP) system.

Example 29. The method of one of examples 21 to 27, where the kinetic energy of the plasma-excited Ar gas is controlled by applying a RF or pulsed DC bias voltage to the substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a metal, the method comprising:
performing at least two cycles of an etch process, wherein each cycle comprises:
   performing a surface modification on an exposed surface of a metal layer of a substrate, the metal layer and a dielectric layer of the substrate having a coplanar top surface;
   performing a hydrogen treatment on the metal layer, wherein the hydrogen treatment forms a layer of reaction products on the metal layer; and
   performing a cleaning treatment on the metal layer, wherein the cleaning treatment removes the layer of reaction products.

2. The method of claim 1, wherein the surface modification comprises oxidizing the exposed surface of the metal layer.

3. The method of claim 1, wherein the hydrogen treatment comprises exposing the metal layer to a plasma-excited $H_2$ gas.

4. The method of claim 1, wherein the cleaning treatment comprises exposing the metal layer to a plasma-excited noble gas.

5. The method of claim 1, wherein a first cycle of the etch process removes a thickness of 3 Å to 4 Å of the metal layer.

6. A method of smoothing a surface, the method comprising:
providing a substrate, the substrate being planarized and containing a metal layer and a dielectric layer in the same horizontal plane, the metal layer having a rough or oxidized surface; and
performing one or more cycles of a smoothing process, wherein each cycle comprises:
   exposing the rough or oxidized surface to a plasma-excited $H_2$ gas, wherein the plasma-excited $H_2$ gas chemically reduces the oxidized surface of the metal layer and forms a layer of reaction products on the metal layer; and
   exposing the rough or oxidized surface to a plasma-excited Ar gas, wherein the plasma-excited Ar gas removes the layer of reaction products overlying the metal layer, wherein kinetic energy of the plasma-excited Ar gas is at or below a sputtering threshold for removing metal from the metal layer.

7. The method of claim 6, further comprising:
forming a mask over the metal layer, the mask exposing the rough or oxidized surface; and
after performing the one or more cycles of the smoothing process, removing the mask.

8. The method of claim 6, further comprising performing an etch process before performing the smoothing process, wherein a cycle of the etch process comprises:
exposing the metal layer to an oxidizing gas;
exposing the metal layer to the plasma-excited $H_2$ gas; and
exposing the metal layer to the plasma-excited Ar gas.

9. The method of claim 6, wherein the metal layer is selectively etched relative to the dielectric layer.

10. The method of claim 9, wherein the dielectric layer comprises $SiO_2$ or a high-k material.

11. The method of claim 6, wherein the smoothing process utilizes an inductively coupled plasma (ICP) system.

12. The method of claim 6, wherein the kinetic energy of the plasma-excited Ar gas is controlled by applying an RF or pulsed DC bias voltage to the substrate.

13. The method of claim 6, wherein the metal layer comprises copper.

14. A method of etching a metal, the method comprising:
exposing a metal layer of a substrate to a surface modifying gas, the substrate being planarized and containing the metal layer and a dielectric layer in a same horizontal plane, the surface modifying gas oxidizing a surface of the metal layer;
exposing the metal layer to a plasma-excited $H_2$ gas, the plasma-excited $H_2$ gas chemically reducing the oxidized surface of the metal layer and forming a layer of metal-containing reaction products on the metal layer; and
exposing the metal layer to a plasma-excited Ar gas, the plasma-excited Ar gas removing the layer of metal-containing reaction products overlying the metal layer.

15. The method of claim 14, wherein kinetic energy of the plasma-excited Ar gas is at or below a sputtering threshold for removing metal from the metal layer.

16. The method of claim 14, wherein the surface modifying gas comprises a plasma-excited $O_2$ gas.

17. The method of claim 16, wherein kinetic energy of the plasma-excited $O_2$ gas is at or below a sputtering threshold for removing metal from the metal layer.

18. The method of claim 14, wherein the metal layer is selectively etched relative to the dielectric layer.

19. The method of claim 6, wherein the smoothing process utilizes a rotating DC magnetic field system.

20. The method of claim 14, wherein the metal layer is a copper (Cu) metal layer.

* * * * *